US009841688B2

United States Patent
Ko et al.

(10) Patent No.: US 9,841,688 B2
(45) Date of Patent: Dec. 12, 2017

(54) METHOD FOR DETECTING OVERLAY ERROR AND METHOD FOR MANUFACTURING SEMICONDUCTOR DEVICE USING THE SAME

(71) Applicants: Kang-Woong Ko, Seoul (KR); Hyoung-Jo Jeon, Suwon-si (KR); Masahiro Horie, Suwon-si (KR); Gil-Woo Song, Hwaseong-si (KR)

(72) Inventors: Kang-Woong Ko, Seoul (KR); Hyoung-Jo Jeon, Suwon-si (KR); Masahiro Horie, Suwon-si (KR); Gil-Woo Song, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 151 days.

(21) Appl. No.: 14/978,916

(22) Filed: Dec. 22, 2015

(65) Prior Publication Data

US 2016/0300767 A1    Oct. 13, 2016

(30) Foreign Application Priority Data

Apr. 10, 2015 (KR) ........................ 10-2015-0050912

(51) Int. Cl.
| | | |
|---|---|---|
| *G03F 7/20* | (2006.01) | |
| *H01L 21/66* | (2006.01) | |
| *G01B 11/27* | (2006.01) | |
| *G01B 11/14* | (2006.01) | |
| *H01L 23/544* | (2006.01) | |

(52) U.S. Cl.
CPC .......... *G03F 7/70633* (2013.01); *G01B 11/14* (2013.01); *G01B 11/27* (2013.01); *H01L 22/12* (2013.01); *H01L 23/544* (2013.01)

(58) Field of Classification Search
CPC ..... G03F 7/70633; G01B 11/14; G01B 11/24; G01B 11/27; H01L 22/12; H01L 23/544
USPC ....... 356/399–401; 355/53, 55, 77; 250/548; 430/5, 22, 30; 382/151; 438/7, 16, 401; 257/797
See application file for complete search history.

(56) References Cited

U.S. PATENT DOCUMENTS

| | | | |
|---|---|---|---|
| 5,907,405 A | 5/1999 | Mizutani et al. | |
| 6,463,184 B1 | 10/2002 | Gould et al. | |
| 6,633,831 B2 | 10/2003 | Nikoonahad et al. | |
| 6,673,637 B2 | 1/2004 | Wack et al. | |
| 6,782,337 B2 | 8/2004 | Wack et al. | |

(Continued)

FOREIGN PATENT DOCUMENTS

JP    2000-294493 A    10/2000

*Primary Examiner* — Gordon J Stock, Jr.
(74) *Attorney, Agent, or Firm* — Myers Bigel, P.A.

(57) ABSTRACT

A method for detecting an overlay error includes: forming a first overlay key including a plurality of spaced apart first target patterns having a first pitch on a first layer of a substrate; forming a second overlay key including a plurality of spaced apart second target patterns having a second pitch different than the first pitch on a second layer of the substrate below the first layer; irradiating the first layer and the second layer with incident light having a first wavelength; obtaining a phase pattern of light reflected from the first layer and the second layer; calculating a position of a peak point or a valley point of the phase pattern of the reflected light; and detecting an overlay error of the first layer and the second layer using the position of the peak point or the valley point of the phase pattern.

20 Claims, 10 Drawing Sheets

(56) References Cited

U.S. PATENT DOCUMENTS

| | | |
|---|---|---|
| 6,806,951 B2 | 10/2004 | Wack et al. |
| 6,818,459 B2 | 11/2004 | Wack et al. |
| 6,891,610 B2 | 5/2005 | Nikoonahad et al. |
| 6,891,627 B1 | 5/2005 | Levy et al. |
| 6,917,419 B2 | 7/2005 | Fielden et al. |
| 6,919,957 B2 | 7/2005 | Nikoonahad et al. |
| 6,949,462 B1 | 9/2005 | Yang et al. |
| 7,006,235 B2 | 2/2006 | Levy et al. |
| 7,106,425 B1 | 9/2006 | Bultman et al. |
| 7,130,029 B2 | 10/2006 | Wack et al. |
| 7,280,212 B2 | 10/2007 | Mieher et al. |
| 7,492,049 B2 * | 2/2009 | Do ................. G03F 7/70625 257/797 |
| 7,616,313 B2 | 11/2009 | Kandel et al. |
| 8,064,056 B2 | 11/2011 | van der Schaar et al. |
| 8,126,258 B2 | 2/2012 | Yang et al. |
| 8,179,530 B2 | 5/2012 | Levy et al. |
| 8,836,943 B2 | 9/2014 | Ahn et al. |
| 2012/0002863 A1 | 1/2012 | Lim et al. |
| 2017/0052458 A1 * | 2/2017 | Tang ................. G03F 7/70633 |

\* cited by examiner

METHOD FOR DETECTING OVERLAY ERROR AND METHOD FOR MANUFACTURING SEMICONDUCTOR DEVICE USING THE SAME

CROSS-REFERENCE TO RELATED APPLICATION

This application claims priority from Korean Patent Application No. 10-2015-0050912 filed on Apr. 10, 2015, the disclosure of which is incorporated herein by reference in its entirety.

BACKGROUND

The present inventive concept relates to a method for detecting an overlay error and a method for manufacturing a semiconductor device using the same.

Several layers can be formed during manufacturing process of a semiconductor. In order to accurately determine a relative structure in which several layers are laminated, that is, an overlay, an overlay key can be used for each layer. In order to accurately determine the overlay, the overlay key can be measured several times based on a plurality of measurement points that are present in the overlay key. However, such a method has a high calculation load and requires additional costs for determining a position of a measurement point. Accordingly, a plan for efficiently measuring the overlay key is desirable.

SUMMARY

An aspect of the present inventive concept provides a method of detecting an overlay error for efficiently measuring an overlay key, using a scatterometry target.

Another aspect of the present inventive concept provides a detecting method of detecting an overlay error for efficiently measuring the overlay key, using an image ellipsometer or a spectroscopic image ellipsometer.

Still another aspect of the present inventive concept provides a method for manufacturing a semiconductor device, using a detecting method of detecting an overlay error for efficiently measuring the overlay key by the use of an image ellipsometer or a spectroscopic image ellipsometer.

Still another aspect of the present inventive concept provides an overlay key for efficiently measuring an overlay error using an image ellipsometer or a spectroscopic image ellipsometer.

Still another aspect of the present inventive concept provides a method for detecting an overlay error. The method includes: forming a first overlay key on a first layer of a substrate, with the first overlay key including a plurality of spaced apart first target patterns having a first pitch; forming a second overlay key on a second layer of the substrate above or below the first layer, with the second overlay key including a plurality of spaced apart second target patterns having a second pitch different than the first pitch; irradiating the first layer and the second layer with incident light having a first wavelength; obtaining a phase pattern of light reflected from the first layer and the second layer; calculating a position of a peak point or a valley point of the phase pattern; and detecting an overlay error of the first layer and the second layer using the position of the peak point or the valley point of the phase pattern.

Still another aspect of the present inventive concept provides a method for detecting an overlay error. The method includes: forming a first overlay key on a first layer of a substrate, with the first overlay key including a plurality of spaced apart first target patterns having a first pitch; forming a second overlay key on a second layer of the substrate that is below the first layer, with the second overlay key including a plurality of spaced apart second target patterns having a second pitch that is different than the first pitch; irradiating the first layer and the second layer with incident light having a first wavelength; receiving light reflected from the first layer and the second layer to obtain a phase pattern of the reflected light using an image ellipsometer; calculating a position of a peak point or a valley point of the phase pattern of the reflected light; and detecting an overlay error of the first layer and the second layer using the position of the peak point or the valley point of the phase pattern.

Still another aspect of the present inventive concept provides a method for detecting an overlay error. The method includes: forming a first overlay key on a first layer of a substrate, with the first overlay key including a plurality of spaced apart first target patterns having a first pitch; forming a second overlay key on a second layer of the substrate disposed over the first layer, with the second overlay key overlapping the first overlay key and including a plurality of spaced apart second target patterns having a second pitch different than the first pitch; forming a third overlay key on the second layer, with the third overlay key including a plurality of spaced apart third target patterns having a third pitch; forming a fourth overlay key on a third layer of the substrate disposed over the second layer, with the fourth overlay key overlapping the third overlay key and including a plurality of spaced apart fourth target patterns having a fourth pitch different than the third pitch; irradiating the first layer and the second layer with first incident light having a first wavelength and detecting an overlay error of the first layer and the second layer using a position of a peak point or a valley point of a phase pattern of reflected light; and irradiating the second layer and the third layer with second incident light having a second wavelength and detecting an overlay error of the second layer and the third layer using a position of a peak point or a valley point of the phase pattern of reflected light.

Still another aspect of the present inventive concept provides a method for manufacturing a semiconductor device. The method includes: providing a substrate in which a first region and a second region are defined, with a semiconductor chip including a first element and a second element being formed in the first region, and with an overlay pattern including first and second target patterns being formed in the second region; and detecting an overlay error using the overlay pattern. The semiconductor chip and the overlay pattern are formed by: forming the first elements spaced apart at a first pitch on the first region and forming first target patterns spaced apart by the first pitch on the second region; and forming the second elements spaced apart by a second pitch smaller than the first pitch on the first region and forming second target patterns spaced apart by the second pitch on the second region. Detecting the overlay error using the overlay pattern includes: irradiating the first and second target patterns with incident light having a first wavelength; obtaining a phase pattern of light reflected from the first and second target patterns; and detecting the overlay error of the first and second target patterns by analyzing a phase pattern of the reflected light.

According to some embodiments, the first region is the region where chips are formed and the second region is the region where overlay keys are formed. The first and second elements may refer to semiconductor patterns formed on the first region (i.e., the region where chips are formed) such as gate patterns, active patterns, etc.

Still another aspect of the present inventive concept provides a system for detecting an overlay error. The system includes: a computing system which includes one or more processors and a memory; and an image ellipsometer which includes one or more image sensors and is configured to measure a semiconductor substrate using the image sensor. The substrate includes a first layer and a second layer disposed above or below the first layer. The first layer includes a first overlay key including a plurality of spaced apart first target patterns having a first pitch. The second layer includes a second overlay key including a plurality of spaced apart second target patterns having a second pitch different than the first pitch. The image ellipsometer is configured to irradiate the first layer and the second layer with incident light having a first wavelength, and to obtain a phase pattern image of light reflected from the first layer and the second layer using the image sensor. The computing system is configured to load the phase pattern image of the reflected light provided from the image ellipsometer to the memory, and to calculate a position of a peak point or a valley point of the phase pattern of the reflected light using the processor. The processor is configured to detect the overlay error of the first layer and the second layer using the position of the peak point or the valley point of the phase pattern.

Still another aspect of the present inventive concept provides an overlap key. The overlap key includes: a first overlay key which is formed on a first layer of a substrate and includes a plurality of spaced apart first target patterns having a first pitch; and a second overlay key which is formed on a second layer of the substrate disposed above or below the first layer and includes a plurality of spaced apart second target patterns having a second pitch different than the first pitch.

These and other aspects of the present inventive concept that have not been mentioned above will become more apparent to one of ordinary skill in the art to which the present inventive concept pertains by referencing the detailed description of the present inventive concept given below.

BRIEF DESCRIPTION OF THE DRAWINGS

The above and other aspects and features of the present inventive concept will become more apparent by describing in detail example embodiments thereof with reference to the attached drawings, in which.

DETAILED DESCRIPTION OF THE EMBODIMENTS

Figure 1:
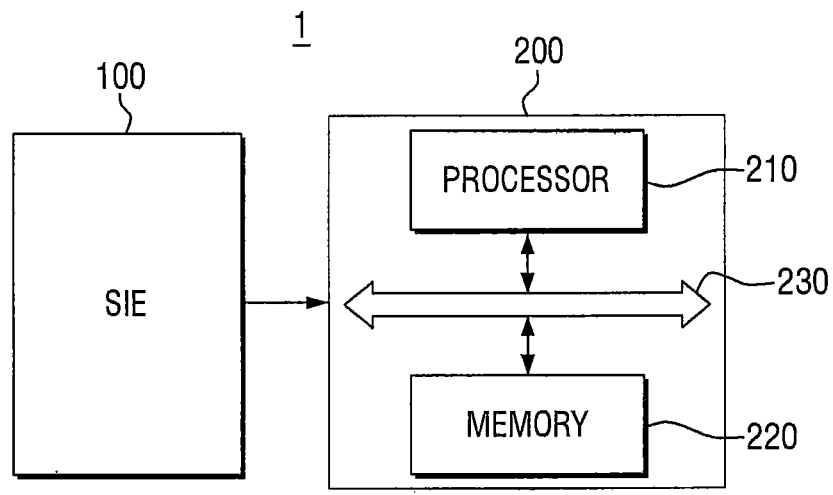
FIG. 1 is a block diagram of a device for detecting an overlay error according to an embodiment of the present inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions may not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element or layer is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a schematic view for explaining a detecting device of an overlay error according to an embodiment of the present inventive concept.

Referring to FIG. 1, a detecting device 1 of an overlay error according to an embodiment of the present inventive concept includes a spectroscopic image ellipsometer (SIE) 100 and a computing system 200.

The spectroscopic image ellipsometer 100 irradiates a semiconductor wafer with incident light, and measures the characteristic values of the semiconductor wafer from light reflected from the semiconductor wafer. Specifically, the spectroscopic image ellipsometer 100 analyzes the semiconductor wafer, by detecting a polarization state reflected from a sample, i.e., the semiconductor wafer. The polarization state can be described as $\psi$ and $\Delta$, where $\psi$ is a reflection coefficient ratio between a p-wave and an s-wave, and $\Delta$ is a phase difference. Thus, the spectroscopic image ellipsometer 100 measures a complex refractive index or the like of the material forming the semiconductor wafer depending on the wavelength of the incident light, thereby providing a variety of information about the sample, i.e., the semiconductor wafer including the complex reflective index, the form, the crystalline state, the chemical structure and the electrical conductivity, as well as a thickness of a thin film including or included on the semiconductor wafer.

In particular, the spectroscopic image ellipsometer 100 used in the various embodiments of the present inventive concept has the following two main characteristics as compared to the general spectroscopic image ellipsometer. First, the spectroscopic image ellipsometer 100 uses the short-wavelength light split by a wavelength selector 112 or a monochrometer illustrated in FIG. 2 as measuring light. Second, the spectroscopic image ellipsometer 100 uses an image sensor or a camera equipped with an image sensor as a detector for detecting the reflected light. However, the scope of the present inventive concept is not limited to the use of only the spectroscopic image ellipsometer 100. That is, the various embodiments of the present inventive concept may be implemented, by using an image sensor or a camera equipped with an image sensor as the detector, and by using the image ellipsometer which uses light of various wavelengths as the measuring light. The specific description of the spectroscopic image ellipsometer 100 will be described below in conjunction with FIG. 2.

The computing system 200 receives data measured by the spectroscopic image ellipsometer 100, for example, data concerning the polarization state of the sample represented by $\psi$ and $\Delta$, and analyzes the data. In some embodiments of the present inventive concept, the computing system 200 includes a processor 210 and a memory 220, and the processor 210 and the memory 220 can transmit and receive the data through a bus 230. For example, the data measured by the spectroscopic image ellipsometer 100 can be stored in the memory 220 of the computing system 200, after being transmitted to the computing system 200. The data stored in the memory 220 can be shown as a graph through analytical software or application running on the processor 210 or can pass through a variety of analytical processes.

In some embodiments of the present inventive concept, the computing system 200 can include a desktop computer, a server, a portable computer such as a notebook computer and a laptop computer, and a mobile device such as a smart phone and a tablet. However, the scope of the present inventive concept is not limited thereto. Meanwhile, in some embodiments of the present inventive concept, the computing system 200 may be directly connected to the spectroscopic image ellipsometer 100 (e.g., though a cable), and may be connected thereto through a wired network including a LAN (Local Area Network) and/or a WAN (Wide Area Network) or through a wireless network including a WiFi network and/or a cellular network to transmit and receive the data each other.

Figure 2:
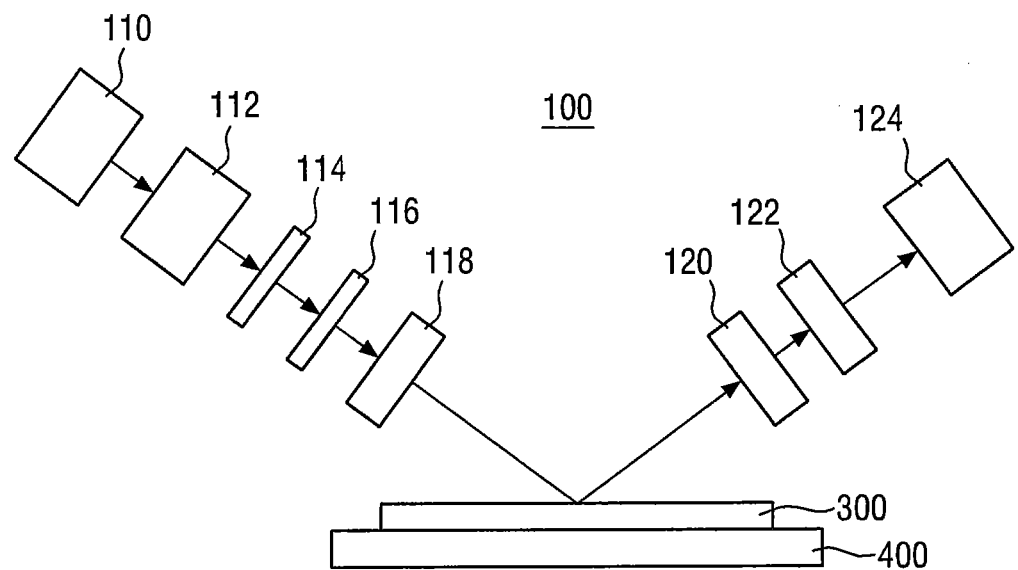
FIG. 2 is a schematic view illustrating a spectroscopic image ellipsometer used in a method for detecting an overlay error according to an embodiment of the present inventive concept.

FIG. 2 is a schematic view for explaining a spectroscopic image ellipsometer used in a method for detecting an overlay error according to an embodiment of the present inventive concept.

Referring to FIG. 2, the spectroscopic image ellipsometer 100 includes a light source 110, a wavelength selector 112, a polarizer 114, a compensator 116, an illuminator 118, imaging optics 120, a polarizing selector 122, an image sensor 124 and the like.

As described above in relation to FIG. 1, the spectroscopic image ellipsometer 100 uses the short-wavelength light as the measuring light. In some embodiments of the present inventive concept, the light source 110 can be a white light source, but the present inventive concept is not limited thereto. Meanwhile, in some other embodiments of the present inventive concept, it is possible to use the wavelength selector 112 for converting the light emitted from the light source 110 into light having a specific wavelength or light having a wavelength of a specific band, for example, a monochrometer or a scanning monochrometer.

Light emitted from the light source 110 is polarized by the polarizer 114 and is irradiated to the sample, i.e., the semiconductor wafer 300, through the illuminator 118 at any incident angle. In some embodiments of the present inventive concept, light generated from the light source 110 can be irradiated to the semiconductor wafer 300 via the compensator 116 as well as the polarizer 114 or can be irradiated to the semiconductor wafer 300 via a phase modulator instead of the compensator 116.

After the light reflected from the semiconductor wafer 300 passes through the imaging optics 120, only specific polarized components thereof are selected by the analyzer 122. In some embodiments of the present inventive concept, the light reflected from the semiconductor wafer 300 may pass through the compensator before being incident on the analyzer 122.

The spectroscopic image ellipsometer 100 includes an image sensor 124, and the image sensor 124 may measure the polarization change or the polarization state of the measuring light passing through the polarizer 114 and the analyzer 122 as an image. Data concerning the polarization change or the polarization state collected in the form of images, for example, data capable of being expressed by $\psi$ and $\Delta$, can be transferred to the computing system 200 illustrated in FIG. 1 and can be processed.

Figure 3:
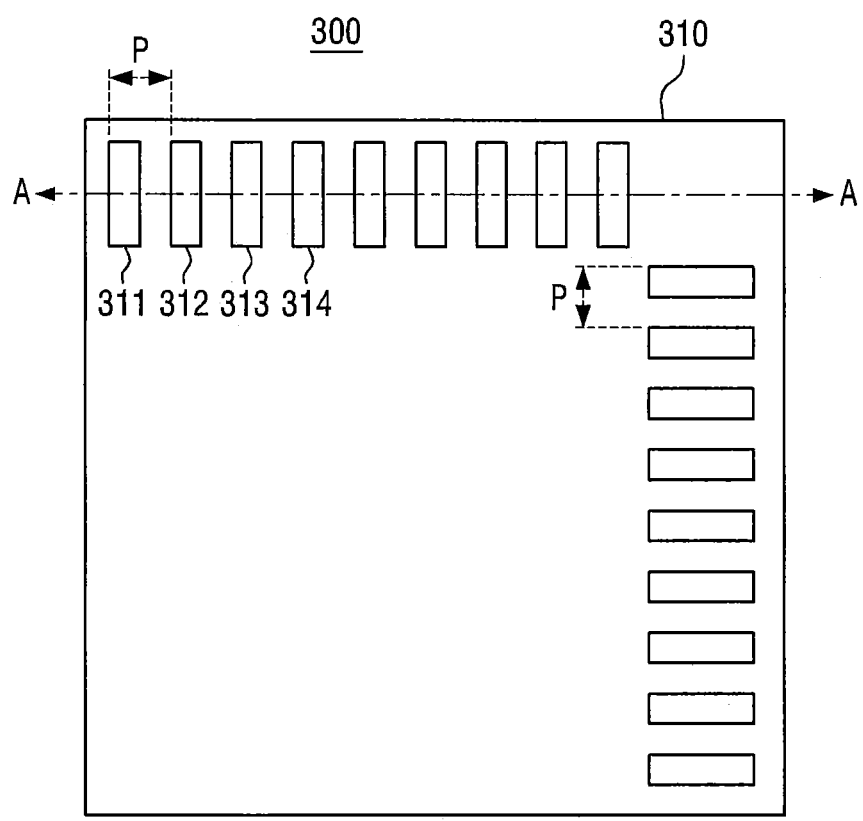
FIG. 3 is a top view illustrating an overlay key used in a method for detecting an overlay error according to an embodiment of the present inventive concept.

FIG. 3 is a top view for illustrating an overlay key used in a method for detecting an overlay error according to an embodiment of the present inventive concept.

Referring to FIG. 3, the semiconductor wafer 300 including a plurality of layers includes an overlay key having a plurality of target patterns. Specifically, the overlay key is formed on a first layer 310 of a semiconductor wafer 300, and the overlay key includes a plurality of target patterns 311, 312, 313, 314 having a pitch P. Here, the target pattern includes a scatterometry target for determining whether the vertically laminated layers are aligned. That is, a second layer 320 is disposed below the first layer 310 illustrated in FIG. 3, and scatterometry target is used to determine whether the first layer 310 and the second layer 320 are aligned.

The scatterometry target, i.e., a plurality of the target patterns 311, 312, 313, 314, can be formed so as to protrude onto or from the first layer 310 or onto or from a certain thin film on the first layer 310. In FIG. 3, the plurality of target patterns 311, 312, 313, 314 are illustrated as a line and space pattern with the target patterns 311, 312, 313, 314 disposed to be spaced apart from each other at a constant interval in a line form, but the present inventive concept is not limited thereto. As long as the pattern is configured so that a plurality of targets is disposed at constant interval or pitch, the pattern is included in the scope of the present inventive concept. For example, a plurality of the target patterns may be a grid pattern.

Meanwhile, the shapes of each of the plurality of target patterns 311, 312, 313, 314 disposed to be spaced apart from each other at constant interval or pitch may be identical to each other. In some embodiments of the present inventive concept, the shapes of the plurality of target patterns 311, 312, 313, 314 can include a rectangular parallelepiped shape or a regular hexahedron shape. Moreover, in some embodiments of the present inventive concept, the plurality of target patterns 311, 312, 313, 314 may be formed of a circuit pattern, for example, an active pin pattern, a dummy gate electrode pattern or the like.

Figure 4:
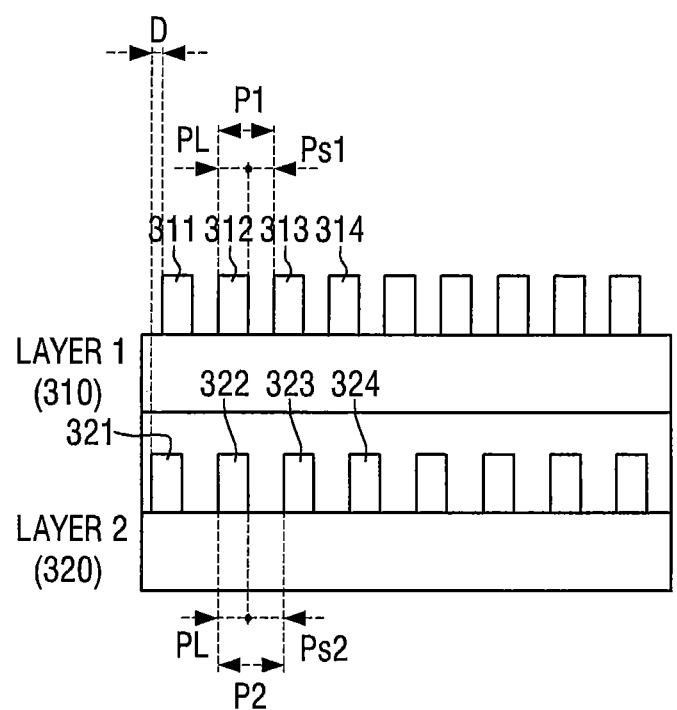
FIG. 4 is a cross-sectional view taken along a line A-A of FIG. 3.

Next, FIG. 4 illustrates a cross-section taken along a line A-A of FIG. 3.

Referring to FIG. 4, the first layer 310 and the second layer 320 are vertically disposed, the first layer 310 is illustrated as an upper layer, and the second layer 320 is illustrated as a lower layer.

The first layer 310 is formed with a first overlay key, and the first overlay key includes the plurality of first target patterns 311, 312, 313, 314 having a first pitch P1. Meanwhile, the second layer 320 disposed vertically to the first layer 310 is formed with a second overlay key, and the second overlay key includes a plurality of second target patterns 321, 322, 323, 324 having a second pitch P2 different from the first pitch $P_1$. A method for detecting an overlay error according to an embodiment of the present inventive concept irradiates the incident light having a specific wavelength, for example, a first wavelength to the first layer 310 including the plurality of first target patterns 311, 312, 313, 314 and the second layer 320 including the plurality of second target patterns 321, 322, 323, 324 disposed as described above. That is, the first layer 310 and the second layer 320, for example, can receive the incident light having a first wavelength from the image ellipsometer and can emit the reflected light of the incident light.

The pitch between the target patterns may be a sum of a space pitch and a line pitch. Here, the space pitch means a pitch between the adjacent target patterns of the plurality of target patterns, and the line pitch means a width of the protruding target pattern itself in a cross-sectional view of FIG. 4. For example, the first pitch P1 corresponding to the plurality of first target patterns 311, 312, 313, 314 formed on the first layer 310 includes a space pitch $P_{S1}$ between the adjacent first target patterns 312, 313 of the plurality of first target patterns 311, 312, 313, 314, and a line pitch PL of the first target pattern 312. Similarly, the second pitch P2 corresponding to the plurality of second target patterns 321, 322, 323, 324 formed on the second layer 320 includes a space pitch $P_{S2}$ between the adjacent second target patterns 322, 323 of the plurality of second target patterns 321, 322, 323, 324 and a line pitch PL of the second target pattern 322.

Here, the space pitch $P_{S1}$ between the first target patterns 311, 312, 313, 314 is different from the space pitch $P_{S2}$ between the second target patterns 321, 322, 323, 324, and meanwhile, the line pitch PL between the first target patterns 311, 312, 313, 314 is identical to the line pitch PL between the second target patterns 321, 322, 323, 324. Referring to FIG. 4, in some embodiments of the present inventive concept, the space pitch $P_{S1}$ between the first target patterns 311, 312, 313, 314 is smaller than the space pitch $P_{S2}$ between the second target patterns 321, 322, 323, 324. However, in some other embodiments of the present inventive concept, the space pitch $P_{S1}$ between the first target patterns 311, 312, 313, 314 may be formed to be greater than the space pitch $P_{S2}$ between the second target patterns 321, 322, 323, 324.

As described above, the pitches of the first target patterns 311, 312, 313, 314 of the first layer 310 and the second target patterns 321, 322, 323, 324 of the second layer 320 only need to be set so as to be different from each other. However, hereinafter, for the convenience of description and in the interest of brevity, the description will be given on the premise that the second pitch P2 of the second target patterns 321, 322, 323, 324 is greater than the first pitch P1 of the first target patterns 311, 312, 313, 314.

In some embodiments of the present inventive concept, a difference value between the second pitch P2 and the first pitch P1 can be within a range of 0.01% of the first pitch P1 to 1% of the first pitch P1. In other words, the difference value between the space pitch $P_{S2}$ and the space pitch $P_{S1}$ can be within a range of 0.01% of the first pitch P1 to 1% of the first pitch P1. Preferably, the difference value between the second pitch P2 and the first pitch P1 can be 0.01% of the first pitch P1 (i.e., P1/1000).

In various embodiments of the present inventive concept, an overlay error is measured by analyzing a Moire pattern obtained from the reflected light, and the range of numerical values of the difference value between the second pitch P2 and the first pitch P1 can be derived from a Moire Equation that shows a relationship between a period 2d of the Moire pattern, the first pitch P1, and a difference value δP between the second pitch P2 and the first pitch P1.

The Moire pattern obtained from the reflected light can include a first dark zone, a second dark zone, and a pale zone between the first dark zone and the second dark zone. Assuming that n first target patterns are formed between the center of the pale zone and the center of the second dark zone, a distance from the center of the pale zone to the center of the second dark zone is d=n·P1. Meanwhile, since the center of the first dark zone is shifted by P1/2 and the n-th pattern of the second target pattern is shifted by n·δP than or relative to the n-th pattern of the first target pattern, n·δP=P1/2 is established. The following Moire equation can be derived from this.

$$2d=P1^2/\delta P$$

According to the various embodiments of the present inventive concept, in order to measure the Moire pattern of the reflected light, the target patterns should form one Moire cycle (i.e., 2d), and at least 10 patterns should be included in one pixel of the image sensor 124 that takes an image of the Moire pattern. In order to measure the Moire pattern, the image sensor 124 requires at least 100 pixels. Thus, one Moire cycle (i.e., 2d) should be preferably 10*100*P1=1000 P1. In other words, in order to obtain the sufficient resolution of the image sensor 124, about 100 to about 10,000, and preferably, about 1,000 target patterns having the first pitch P1 should be included within the period 2d of the Moire pattern. In this case, the value δP can have the following range.

$$P1^2/10000P1 \leq \delta P \leq P1^2/100P1$$

Preferably, when 1,000 target patterns having the first pitch P1 are included in the period 2d of the Moire pattern, the value δP may be derived as follows.

$$\delta P=P1^2/1000P1$$

By such a process, the difference value between the second pitch P2 and the first pitch P1 may be in the range of 0.01% of the first pitch P1 to 1% of the first pitch P1, and preferably, 0.01% of the first pitch P1.

Meanwhile, the first pitch P1 can be selected from a first wavelength or lower. If the first pitch P1 exceeds the first wavelength, the emitting direction of the reflected light deviates from the image sensor 124, which makes it difficult to measure an overlay error. For the same reason, the first pitch P1 can be selected from 1% or more of the first wavelength. Preferably, in order to be able to ensure the stability and accuracy of the overlay error measurement, the first pitch P1 can be selected to be about 10% of the first wavelength.

By varying the arrangements of the first target patterns 311, 312, 313, 314 of the first layer 310 and the second target patterns 321, 322, 323, 324 of the second layer 320 so as to satisfy these conditions, it is possible to expect the interference effect of the reflected light from the first layer 310 and the second layer 320. The phase pattern due to the interference of the reflected light from the first layer 310 and the second layer 320 will be described below in reference to FIG. 5.

In some embodiments of the present inventive concept, at least one of the widths, the lengths and the heights of the first target patterns 311, 312, 313, 314 and the second target patterns 321, 322, 323, 324 may be identical to each other. Furthermore, in some embodiments of the present inventive concept, the shapes of the first target patterns 311, 312, 313, 314 and the second target patterns 321, 322, 323, 324 may be identical to each other. However, it is important that the first pitch P1 and the second pitch P2 are different from each other in the first target patterns 311, 312, 313, 314 and the second target patterns 321, 322, 323, 324.

Meanwhile, as described above, the first target patterns 311, 312, 313, 314 and the second target patterns 321, 322, 323, 324 may include a circuit pattern. In some embodiments of the present inventive concept, one of the first target patterns 311, 312, 313, 314 and the second target patterns 321, 322, 323, 324 can include a photo resist pattern. In some embodiments of the present inventive concept, one of the first target patterns 311, 312, 313, 314 and the second target patterns 321, 322, 323, 324 can include a borophosphosilicate glass (BPSG) pattern.

Meanwhile, in some embodiments of the present inventive concept, the widths of the first target patterns 311, 312, 313, 314 or the widths of the second target patterns 321, 322, 323, 324 can be in the range of 10 μm to 200 μm. In order to perform the optical focusing to measure an overlay error of a semiconductor device, the widths of the first target patterns 311, 312, 313, 314 or the widths of the second target patterns 321, 322, 323, 324 are preferably formed so as to satisfy the above-mentioned range, but the range of widths of the present inventive concept is not limited thereto.

In a method for detecting an overlay error according to an embodiment of the present inventive concept, as described above, after irradiating the incident light having a first wavelength to the first layer 310 including the plurality of first target patterns 311, 312, 313, 314 and the second layer 320 including the plurality of second target patterns 321, 322, 323, 324 disposed as described above, the phase pattern of the reflected light to the incident light is obtained from the light reflected from the first layer 310 and the second layer 320. The method for detecting the overlay error according to an embodiment of the present inventive concept analyzes the obtained phase pattern of the reflected light to detect an overlay error of the first layer 310 and the second layer 320.

Figure 5:
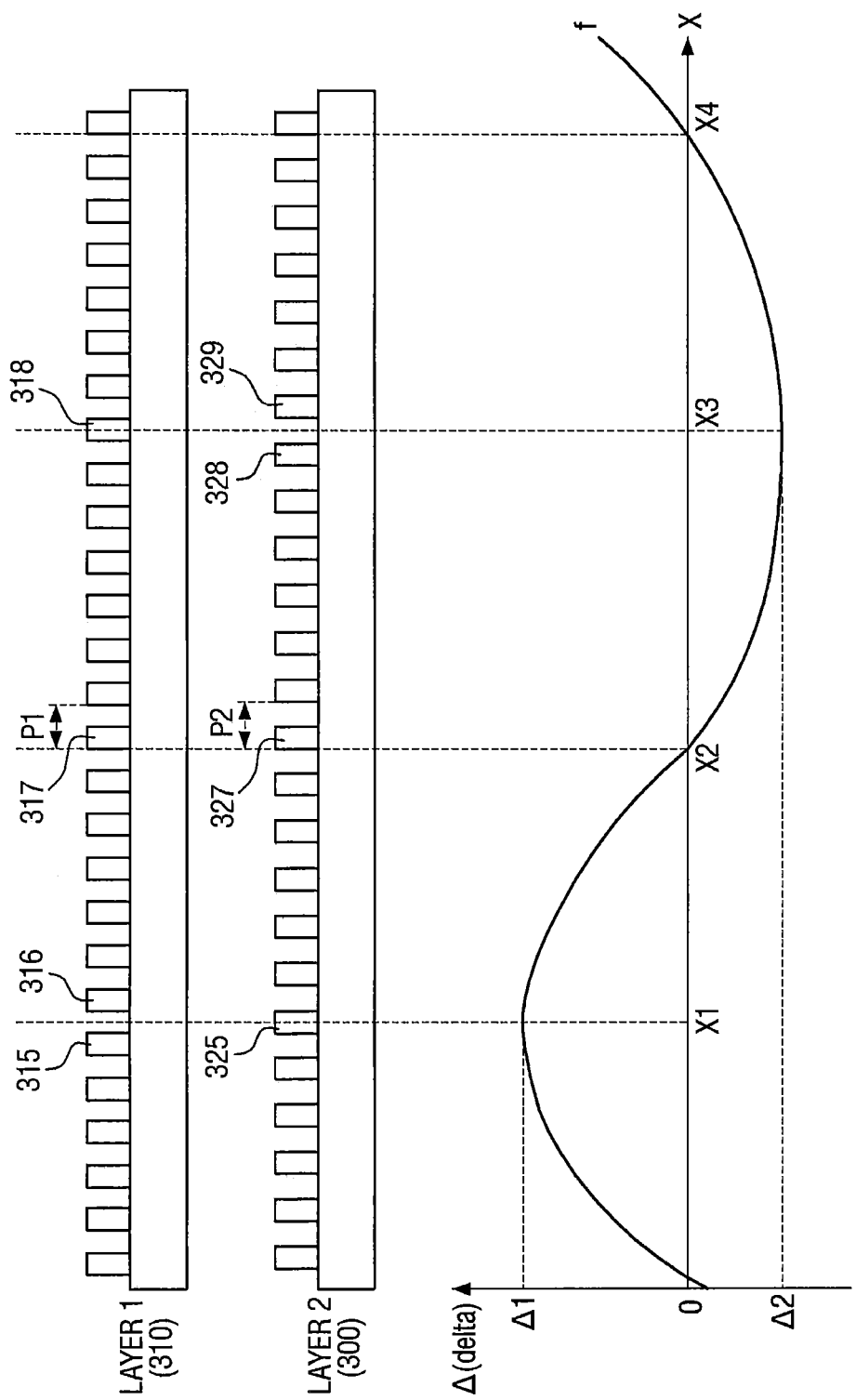
FIG. 5 is a diagram for explaining a phase pattern of the method for detecting the overlay error according to an embodiment of the present inventive concept.

FIG. 5 is a diagram for explaining the phase pattern of the method for detecting the overlay error according to an embodiment of the present inventive concept.

Referring to FIG. 5, the graph of FIG. 5 shows Δ, which means the phase difference obtained from spectroscopic image ellipsometer 100 through the measurement as described in FIG. 4, in an x-axis direction of the overlay.

The first target patterns 315, 316 formed in the first layer 310 at a point X1 have a phase which is exactly opposite to the second target pattern 325 formed on the second layer 320. This is a case where the overlay error of the first layer 310 and the second layer 320 is maximum. Δ at the point X1 has a peak point Δ1. Similarly, a first target pattern 318 formed on the first layer 310 at a point $x_3$ has a phase which is exactly opposite to the second target patterns 328, 329 formed on the second layer 320. This case also corresponds to a case where an overlay error of the first layer 310 and the second layer 320 is maximum. Δ at the point $x_3$ has a valley point Δ2.

Meanwhile, the first target pattern 317 formed on the first layer 310 at the point X2 has the same phase as the second target pattern 327 formed on the second layer 320. That is, this is a case where the first layer 310 and the second layer 320 are arranged and the overlay error is minimum or a case where there is no overlay error. The point X2 can correspond to an inflection point at which the sign of the second derivative changes in the curve f showing Δ. A point $x_4$ is also a case where the first layer 310 and the second layer 320 are arranged and the overlay error is minimum, or a case where there is no overlay error, and the point $x_4$ can correspond to the inflection point of the curve f.

That is, the phase patterns due to the interference of the reflected light from the first layer 310 formed with the target patterns having the first pitch P1 and the second layer 320 formed with the target patterns having the second pitch P2 can be expressed as the curve f showing Δ as described above. By analyzing Δ showing the curve f, it is possible to detect the overlay error of the first layer 310 and the second layer 320, or it is possible to calculate the offset value of the first overlay key of the first layer 310 and the second overlay key of the second layer 320.

In particular, in some embodiments of the present inventive concept, the method for detecting the overlay error according to an embodiment of the present inventive concept further includes acquiring a reference phase pattern of the measured reflected light, when the first layer 310 and the second layer 320 are aligned from or with each other. Thus, detecting the overlay error of the first layer 310 the second layer 320 by analyzing the phase pattern of the reflected light can include detecting the overlay error of the first layer 310 and the second layer 320, by analyzing the reference phase pattern and the phase pattern of the reflected light.

Figure 6:
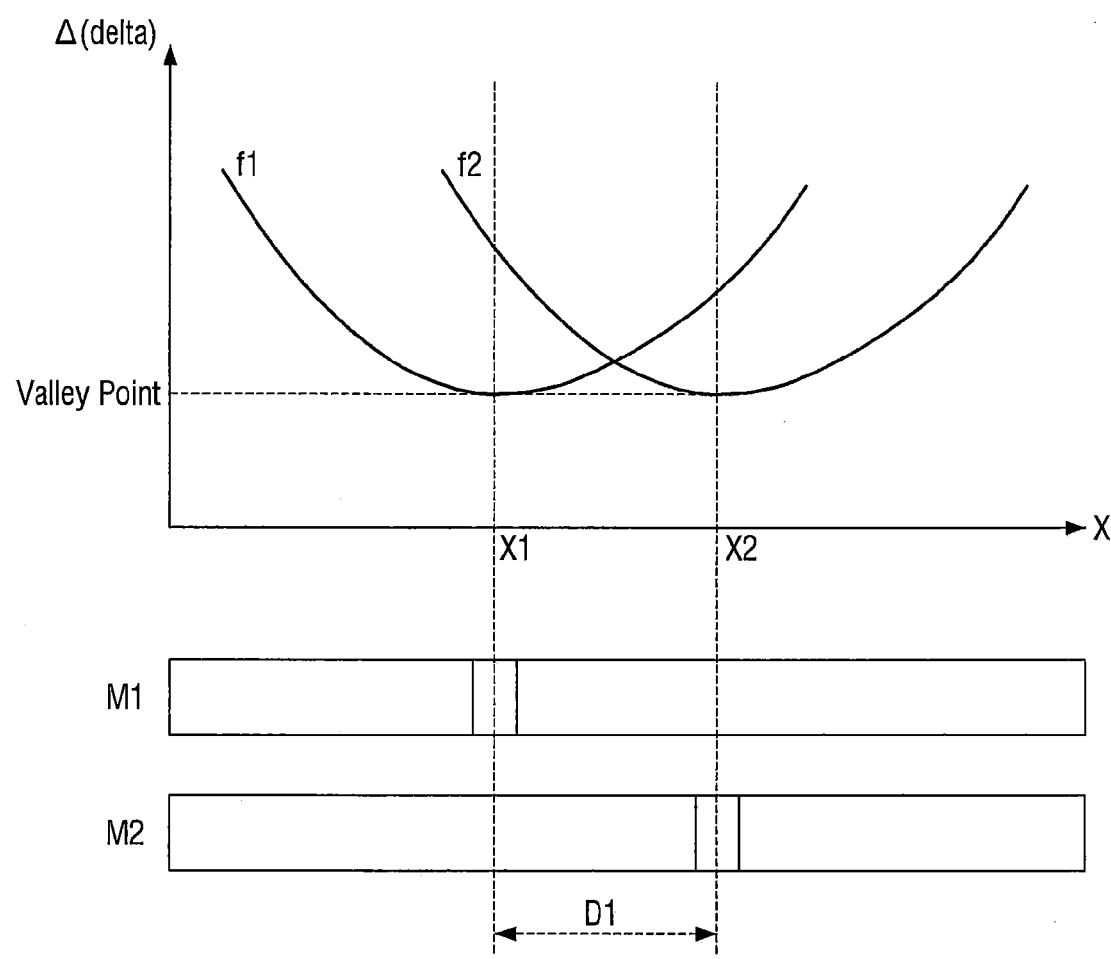
FIGS. 6 and 7 are diagrams for explaining the analysis of the phase pattern of the method for detecting the overlay error according to an embodiment of the present inventive concept.
Figure 7:
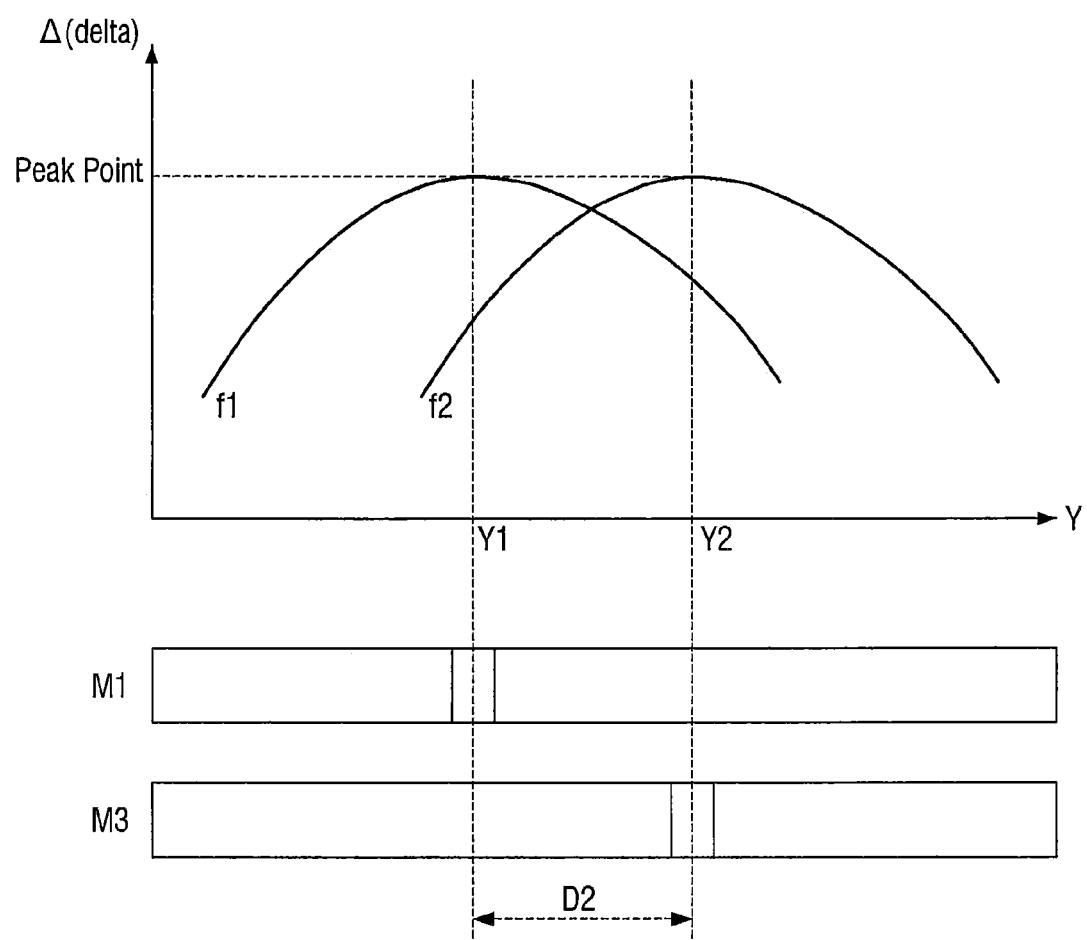

FIGS. 6 and 7 are diagrams for explaining the analysis of the phase pattern of the method for detecting the overlay error according to an embodiment of the present inventive concept.

Referring to FIG. 6, a graph in FIG. 6 shows Δ which means the phase difference obtained from the spectroscopic image ellipsometer 100 through the measurement as described in reference to FIG. 4 in the x-axis direction of the overlay. Here, a curve $f_1$ means a reference phase pattern described above in connection with FIG. 5, and a curve $f_2$ means the phase pattern of the reflected light.

Meanwhile, in the present embodiment, since the reference phase pattern or the phase pattern of the reflected light is measured using the spectroscopic image ellipsometer 100, the reference phase pattern or the phase pattern of the reflected light can be obtained as a reference phase pattern image or a phase pattern image of the reflected light. Here, the reference phase pattern image or the phase pattern image of the reflected light can include an image of the Moire pattern. A gray pattern M1 of the reference phase pattern image and a gray pattern M2 of the phase pattern image of the reflected light are shown in a lower part of the graph of FIG. 6. This can be expressed as a kind of spectrum.

In this embodiment, detecting the overlay error of the first layer 310 and the second layer 320 by analyzing the phase pattern image of the reflected light includes extracting a position of the valley point from the gray pattern M2 of the phase pattern image of the reflected light, and comparing the position of the valley point of the gray pattern M1 of the reference phase pattern image to the position of the valley point of the gray pattern M2 of the phase pattern image of the reflected light, thereby detecting the overlay error of the first layer 310 and the second layer 320. Here, detecting the overlay error of the first layer 310 and the second layer 320 can include calculating an offset value D1 between the first overlay key of the first layer 310 and the second overlay key of the second layer 320.

For example, in FIG. 6, the point X1 is a valley point of the curve $f_1$ in the case of the reference phase pattern image, and meanwhile, the point X2 is a valley point of the curve $f_2$ in the case of the phase pattern image of the reflected light. In other words, if the point X1 as the darkest region in the gray pattern M1 of the reference phase pattern image corresponds to the valley point of the curve $f_1$, the point X2 corresponding to the valley point of the curve $f_2$ as the darkest region in the gray pattern M2 of the phase pattern image of the reflected light is away from the point X1. It is possible to determine that the first overlay key of the first layer 310 and the second overlay key of the second layer 320 are shifted by the offset value D1 through the spectral analysis.

Referring to FIG. 7, a graph of FIG. 7 shows Δ which means the phase difference obtained from the spectroscopic image ellipsometer 100 through the measurement as described in reference to FIG. 4 in the y-axis direction of the overlay. Here, the curve $f_1$ means the reference phase pattern described above in connection with FIG. 5, and the curve $f_2$ means the phase pattern of the reflected light.

In this embodiment, detecting the overlay error of the first layer 310 and the second layer 320 by analyzing the phase pattern image of the reflected light includes extracting a position of the peak point from the gray pattern M3 of the phase pattern image of the reflected light and comparing the position of the peak point of the gray pattern M1 of the reference phase pattern image to the position of the peak point of the gray pattern M3 of the phase pattern image of the reflected light, thereby detecting the overlay error of the first layer 310 and the second layer 320. Here, detecting the overlay error of the first layer 310 and the second layer 320 can includes calculating an offset value D2 between the first overlay key of the first layer 310 and the second overlay key of the second layer 320.

For example, in FIG. 7, the point Y1 is a peak point of the curve $f_1$ in the case of the reference phase pattern image, and meanwhile, the point Y2 is a peak point of the curve $f_2$ in the case of the phase pattern image of the reflected light. In other words, if the point Y1 as the brightest region in the gray pattern M1 of the reference phase pattern image corresponds to the peak point of the curve $f_1$, the point Y2 corresponds to the peak point of the curve $f_2$ as the brightest region in the gray pattern M3 of the phase pattern image of the reflected light is away from the point Y1. It is possible to determine that the first overlay key of the first layer 310 and the second overlay key of the second layer 320 are shifted by the offset value D2 through the spectral analysis.

In some embodiments of the present inventive concept, it is possible to manufacture a semiconductor device using the above-described method. Specifically, the method includes providing a substrate in which a first region and a second region are defined, a semiconductor chip including a first element and a second element being formed in the first region, an overlay pattern including the first and second target patterns being formed in the second region; and detecting the overlay error using the overlay pattern. Forming the semiconductor chip and the overlay pattern includes forming the first element spaced apart at a first pitch in the first region, forming the first target pattern spaced apart by the first pitch in the second region, forming the second element spaced apart by a second pitch smaller than the first pitch in the first region, and forming the second target pattern spaced apart by the second pitch on the first target pattern. Detecting the overlay error using the overlay pattern includes irradiating the incident light having a first wavelength to the first and second target patterns, obtaining the phase pattern of the reflected light from the incident light from the light reflected from the first and second target patterns, and detecting the overlay error of the first and second target patterns by analyzing the phase pattern of the reflected light. Here, the first element and the second element can include semiconductor elements including a gate, a contact, a spacer or the like, but the scope of the present inventive concept is not limited thereto.

Meanwhile, in some embodiments of the present inventive concept, a system for detecting an overlay error using the method includes a computing system which includes one or more processors and a memory; and an image ellipsometer which includes one or more image sensors and measures a semiconductor substrate using the image sensors. The substrate includes a first layer and a second layer disposed perpendicular to the first layer (e.g., below the first layer). The first layer includes a first overlay key including a plurality of first target patterns having a first pitch, and the second layer includes a second overlay key including a plurality of second target patterns having a second pitch different from the first pitch. The image ellipsometer irradiates the first layer and the second layer with incident light having a first wavelength, and obtains the phase pattern image of the reflected light reflected from the first layer and the second layer using the image sensor. The computing system loads the phase pattern image of the reflected light provided from the image ellipsometer to the memory, and calculates the position of the peak point or the valley point of the phase pattern of the reflected light using the processor. The processor detects the overlay error of the first layer and the second layer using the position of the peak point or the valley point of the phase pattern.

Figure 8:
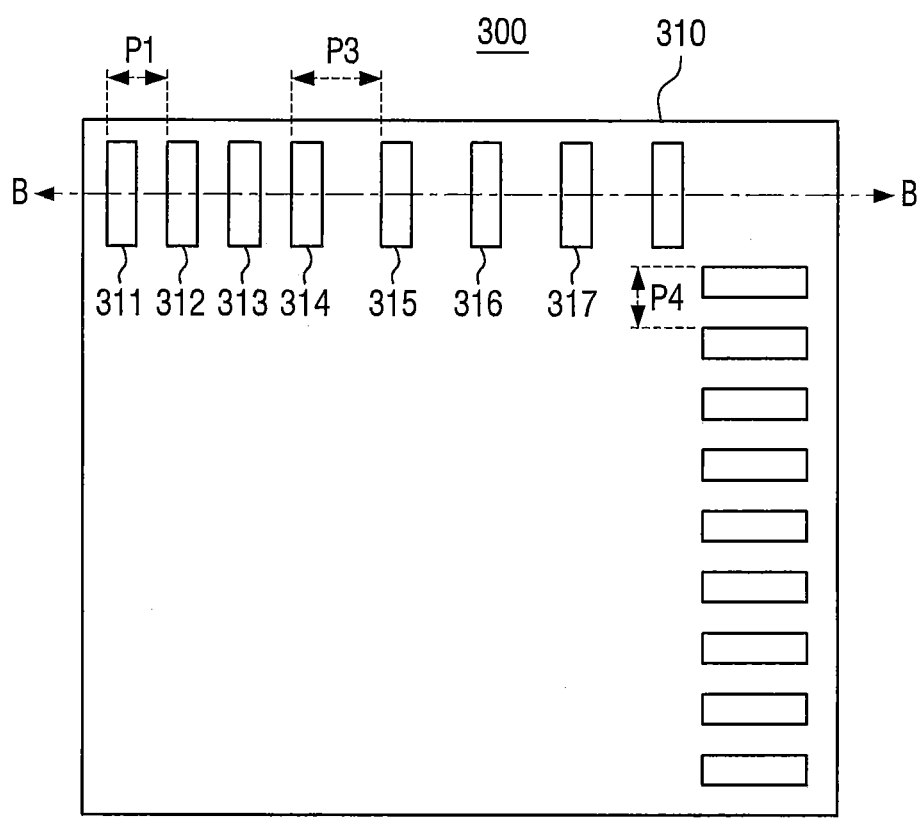
FIG. 8 is a top view illustrating an overlay key used in a method for detecting an overlay error according to another embodiment of the present inventive concept.

FIG. 8 is a top view for illustrating an overlay key of a method for detecting an overlay error according to another embodiment of the present inventive concept.

Referring to FIG. 8, it differs from the embodiment illustrated in FIG. 3 in that a first overlay key and a third overlay key are formed on the first layer 310 of the semiconductor wafer 300, the first overlay key includes a plurality of target patterns 311, 312, 313, 314 having a first pitch P1, and the third overlay key includes a plurality of target patterns 315, 316, 317 having a third pitch $P_3$. Further, other target patterns having a fourth pitch $P_4$ can also be formed in other regions of the first layer 310 of the semiconductor wafer 300.

Figure 9:
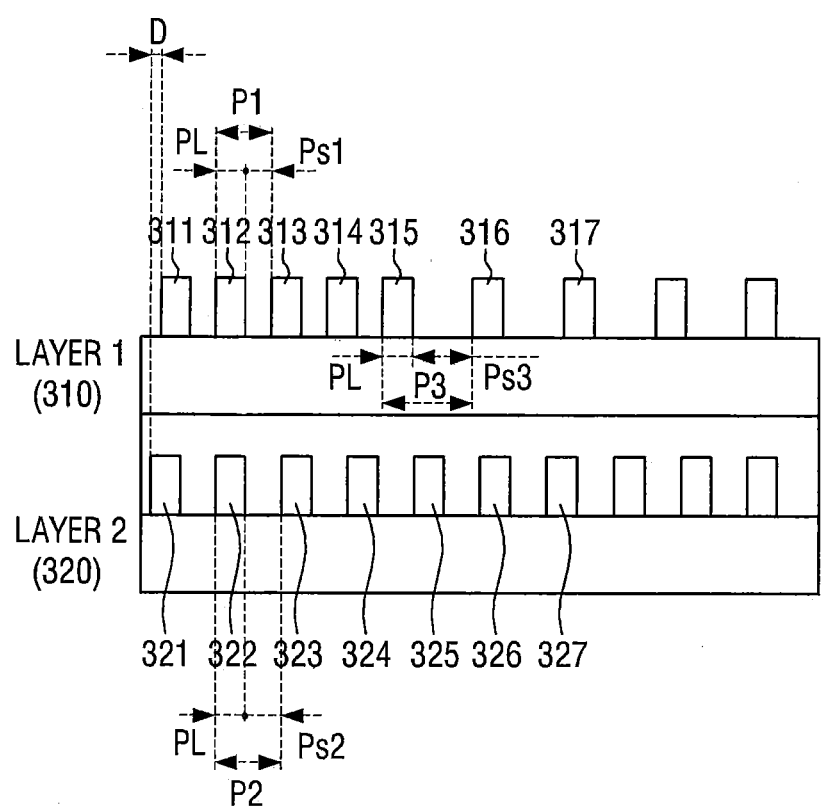
FIG. 9 is a cross-sectional view taken along a line B-B of FIG. 8.

Next, FIG. 9 illustrates a cross-section view taken along a line B-B of FIG. 8.

Referring to FIG. 9, the first overlay key is formed on the first layer 310, and the first overlay key includes a plurality of first target patterns 311, 312, 313, 314 having a first pitch P1. Also, the third overlay key is further formed on the first layer 310, and the third overlay key includes a plurality of third target patterns 315, 316, 317 having a third pitch $P_3$. Meanwhile, the second overlay key is formed on the second layer 320 disposed perpendicular to the first layer 310, and the second overlay key includes a plurality of second target patterns 321, 322, 323, 324 having the second pitch P2 different from the first pitch P1. Here, the second pitch P2 can be greater than the first pitch P1 and can be smaller than the third pitch $P_3$.

In other words, since all the line pitches PL of the first target patterns 311, 312, 313, 314, the second target patterns 321, 322, 323, 324 and the third target the patterns 315, 316, 317 are identical to each other, a space pitch $P_{S2}$ of the second target patterns 321, 322, 323, 324 can be greater than a space pitch $P_{S1}$ of the first target patterns 311, 312, 313, 314 and can be smaller than a space pitch $P_{S3}$ of the third target patterns 315, 316, 317.

Figure 10:
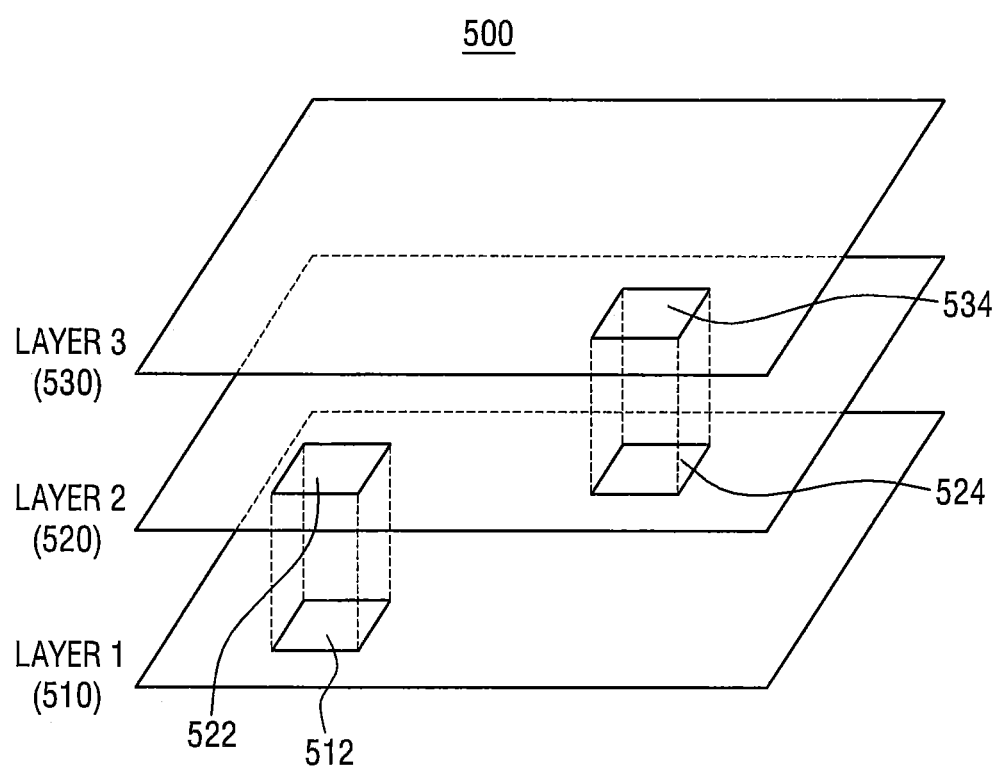
FIG. 10 is a schematic view illustrating an overlay key of a method for detecting an overlay error according to still another embodiment of the present inventive concept.

FIG. 10 is a schematic view for explaining an overlay key of a method for detecting an overlay error according to still another embodiment of the present inventive concept.

Referring to FIG. 10, a first overlay key 512 is formed on a first layer 510 of a semiconductor wafer 500, and a second overlay key 522 is formed on a second layer 520 of the semiconductor wafer 500 so as to overlap the first overlay key 512. The first overlay key 512 and the second overlay key 522 are used to detect the overlay error of the first layer 510 and the second layer 520. Meanwhile, a third overlay key 524 is formed on the second layer 520 of the semiconductor wafer 500, and a fourth overlay key 534 is formed on the third layer 530 of the semiconductor wafer 500 so as to overlap the third overlay key 524. The third overlay key 524 and the fourth overlay key 534 are used to detect the overlay error of the second layer 520 and the third layer 530.

Figure 11:
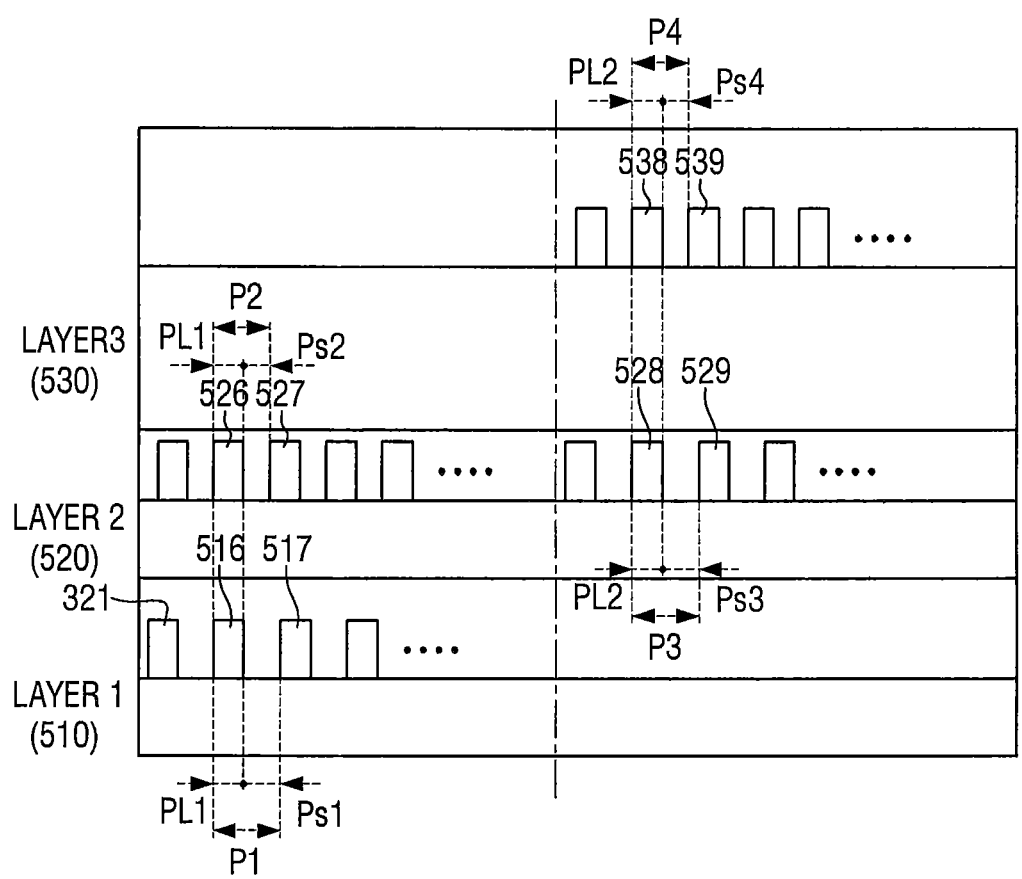
FIG. 11 is a cross-sectional view of multiple layers according to the embodiment of FIG. 10.

Next, FIG. 11 shows a cross-section obtained by cutting the multiple layers according to the embodiment of FIG. 10.

Referring to FIG. 11, the first overlay key 512 includes a plurality of first target patterns 516, 517 having a first pitch P1, and the second overlay key 522 includes a plurality of second target patterns 526, 527 having a second pitch P2 different from the first pitch P1. Meanwhile, the third overlay key 524 includes a plurality of third target patterns 528, 529 having a third pitch $P_3$, and the fourth overlay key 534 includes a plurality of fourth target patterns 538, 539 having a fourth pitch $P_4$ different from the third pitch $P_3$. Here, at least one of the width, the length and the height of the first target patterns 516, 517 and the second target patterns 526, 527 can be identical to each other, and at least one of the width, the length and the height of the third target patterns 528, 529 and the fourth target patterns 538, 539 can be identical to each other.

The method for detecting the overlay error according to the present embodiment includes irradiating the first layer 510 and the second layer 520 with first incident light having a first wavelength and analyzing the phase pattern of the reflected light to detect the overlay error of the first layer 510 and the second layer 520, and irradiating the second layer 520 and the third layer 530 with second incident light having a second wavelength and analyzing the phase pattern of the reflected light to detect the overlay error of the second layer 520 and the third layer 530.

Specifically, irradiating the first layer 510 and the second layer 520 with first incident light having the first wavelength and analyzing the phase pattern of the reflected light to detect the overlay error of the first layer 510 and the second layer 520 can include irradiating the first overlay key 512 of the first layer 510 and the second overlay key 522 of the second layer 520 with the first incident light, obtaining a first phase pattern image of the light reflected from the first layer 510 and the second layer 520, and analyzing the first phase pattern image of the reflected light to calculate an offset value of the first overlay key 512 and the second overlay key 522.

Meanwhile, irradiating the second layer 520 and the third layer 530 with second incident light having the second wavelength and analyzing the phase pattern of the reflected light to detect the overlay error of the second layer 520 and the third layer 530 can include irradiating the third overlay key 524 of the second layer 520 and the fourth overlay key 534 of the third layer 530 with the second incident light, obtaining a second phase pattern image of the reflected light reflected from the second layer 520 and the third layer 530, and analyzing the second phase pattern image of the reflected light to calculate an offset value of the third overlay key 524 and the fourth overlay key 534.

According to the various embodiments of the present inventive concept, it is possible to efficiently measure the overlay key, using a scatterometry target and a spectroscopic image ellipsometer.

In concluding the detailed description, those skilled in the art will appreciate that many variations and modifications can be made to the example embodiments without substantially departing from the principles of the present inventive concept. Therefore, the disclosed example embodiments of the inventive concept are used in a generic and descriptive sense only and not for purposes of limitation.

What is claimed is:

1. A method for detecting an overlay error, the method comprising:
    forming a first overlay key on a first layer of a substrate, the first overlay key including a plurality of spaced apart first target patterns having a first pitch;
    forming a second overlay key on a second layer of the substrate above or below the first layer, the second overlay key including a plurality of spaced apart second target patterns having a second pitch different than the first pitch;
    irradiating the first layer and the second layer with incident light having a first wavelength;
    obtaining a phase pattern of light reflected from the first layer and the second layer;
    calculating a position of a peak point or a valley point of the phase pattern of the reflected light; and
    detecting an overlay error of the first layer and the second layer using the position of the peak point or the valley point of the phase pattern.

2. The method of claim 1, wherein the first pitch includes a space pitch between adjacent first target patterns of the plurality of first target patterns and a line pitch of the first target pattern, and the second pitch includes a space pitch between adjacent second target patterns of the plurality of second target patterns and a line pitch of the second target pattern.

3. The method of claim 2, wherein the line pitch of the first target pattern is the same as the line pitch of the second target pattern.

4. The method of claim 2, wherein the space pitch between the adjacent first target patterns is different than the space pitch between the adjacent second target patterns.

5. The method of claim 4, wherein the space pitch between the adjacent first target patterns is smaller than the space pitch between the adjacent second target patterns.

6. The method of claim 1, wherein the second pitch is greater than the first pitch, and a difference value between the second pitch and the first pitch is within a range of 0.01% of the first pitch to 1% of the first pitch.

7. The method of claim 6, wherein the first pitch is within a range of the first wavelength or less.

8. The method of claim 1, wherein at least one of widths, lengths and heights of the first target pattern and the second target pattern are identical to each other.

9. The method of claim 8, wherein shapes of the first target pattern and the second target pattern are identical to each other.

10. The method of claim 1, wherein the first target pattern and the second target pattern include a circuit pattern.

11. The method of claim 1, further comprising:
    obtaining a reference phase pattern of the reflected light measured when the first layer and the second layer are arranged on the substrate, and
    wherein detecting the overlay error of the first layer and the second layer using the position of the peak point or the valley point of the phase pattern includes:
        calculating a position of a peak point or a valley point of the reference phase pattern; and
        detecting the overlay error of the first layer and the second layer by comparing the position of the peak point or the valley point of the reference phase pattern to the position of the peak point or the valley point of the phase pattern of the reflected light.

12. The method of claim 11, wherein the reference phase pattern and the phase pattern of the reflected light include a Moire pattern.

13. The method of claim 1, wherein detecting the overlay error of the first layer and the second layer using the position of the peak point or the valley point of the phase pattern includes:
    calculating an offset value of the first overlay key of the first layer and the second overlay key of the second layer using the position of the peak point or the valley point of the phase pattern.

14. The method of claim 1, further comprising:
    forming a third overlay key on the first layer or the second layer, the third overlay key including a plurality of third target patterns having a third pitch different from the first pitch and the second pitch.

15. The method of claim 14, wherein the second pitch is greater than the first pitch and the third pitch is smaller than the first pitch.

16. A method for detecting an overlay error, the method comprising:
    forming a first overlay key on a first layer of a substrate, the first overlay key comprising a plurality of spaced apart first target patterns having a first pitch;
    forming a second overlay key on a second layer of the substrate that is below the first layer, the second overlay key comprising a plurality of spaced apart second target patterns having a second pitch that is different than the first pitch;
    irradiating the first layer and the second layer with incident light having a first wavelength;
    receiving light reflected from the first layer and the second layer to obtain a phase pattern of the reflected light using an image ellipsometer;
    calculating a position of a peak point or a valley point of the phase pattern of the reflected light; and
    detecting an overlay error of the first layer and the second layer using the position of the peak point or the valley point of the phase pattern.

17. The method of claim 16, wherein:
    the first pitch comprises a space pitch representing a space between adjacent first target patterns of the plurality of first target patterns and a line pitch representing a width of one of the first target patterns, and
    the second pitch comprises a space pitch representing a space between adjacent second target patterns of the plurality of second target patterns and a line pitch representing a width of one of the second target patterns.

18. The method of claim 17, wherein:
    the peak point corresponds to a center of one of second target patterns being aligned with a center of one of the spaces between adjacent first target patterns; and
    the valley point corresponds to a center of one of first target patterns being aligned with a center of one of the spaces between adjacent second target patterns.

19. The method of claim 16, wherein detecting the overlay error of the first layer and the second layer using the position of the peak point or the valley point of the phase pattern comprises calculating an offset value of the first overlay key of the first layer and the second overlay key of the second layer using the position of the peak point or the valley point of the phase pattern.

20. A method for detecting an overlay error, the method comprising:

forming a first overlay key on a first layer of a substrate, the first overlay key including a plurality of spaced apart first target patterns having a first pitch;

forming a second overlay key on a second layer of the substrate disposed over the first layer, the second overlay key overlapping the first overlay key and including a plurality of spaced apart second target patterns having a second pitch different than the first pitch;

forming a third overlay key on the second layer, the third overlay key including a plurality of spaced apart third target patterns having a third pitch;

forming a fourth overlay key on a third layer of the substrate disposed over the second layer, the fourth overlay key overlapping the third overlay key and including a plurality of spaced apart fourth target patterns having a fourth pitch different than the third pitch;

irradiating the first layer and the second layer with first incident light having a first wavelength and detecting an overlay error of the first layer and the second layer using a position of a peak point or a valley point of a phase pattern of reflected light; and irradiating the second layer and the third layer with second incident light having a second wavelength and detecting an overlay error of the second layer and the third layer using a position of a peak point or a valley point of the phase pattern of reflected light.

* * * * *